(12) United States Patent
Opsahl

(10) Patent No.: US 6,448,755 B1
(45) Date of Patent: Sep. 10, 2002

(54) PHASE DETECTOR WITH LINEAR GAIN SELECTION

(75) Inventor: Paul L. Opsahl, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 32 days.

(21) Appl. No.: 09/660,211

(22) Filed: Sep. 12, 2000

(51) Int. Cl.⁷ .............................................. G01R 23/12
(52) U.S. Cl. ................. 324/76.53; 324/76.79; 324/621; 377/20; 357/223; 702/74
(58) Field of Search ................. 324/76, 76.79, 324/221, 225, 229, 418, 423, 621, 76.53; 327/227, 265; 331/1 A; 357/223, 343; 377/20, 29, 45; 702/74

(56) References Cited

U.S. PATENT DOCUMENTS

| | | | | |
|---|---|---|---|---|
| 3,678,252 A | * | 7/1972 | Payne | 377/20 |
| 4,118,674 A | * | 10/1978 | Ball | 331/17 |
| 4,404,530 A | * | 9/1983 | Stryer | 331/1 A |
| 4,595,886 A | * | 6/1986 | Mroch | 331/1 A |

* cited by examiner

*Primary Examiner*—Michael Sherry
*Assistant Examiner*—Trung Q. Nguyen
(74) *Attorney, Agent, or Firm*—Nathan O. Jensen; Kyle Eppele

(57) ABSTRACT

A phase detector with a linear gain characteristic includes two exclusive-OR gates with inputs connected to an input signal and an inverted input signal and a reference signal in a phase locked loop. The outputs of the exclusive-OR gates are connected to a plurality of switches. The switches are connected to a plurality of resistors and the resistors are connected together to form an output signal. Switches and resistors are selected in complementary pairs by a gain select function to provide a linear gain characteristic for the output signal.

7 Claims, 5 Drawing Sheets

PHASE DETECTOR WITH LINEAR GAIN SELECTION

BACKGROUND OF THE INVENTION

This invention relates to frequency synthesizers, phase locked loops, phase detectors, and more specifically to a phase detector with a linear gain selection capability.

Phase locked loops and circuits for implementing such loops are well known in the art for providing frequency selective outputs that are easily controlled, adjustable, and stable in operation. In particular, a phase locked loop (PLL) generally includes a voltage controlled oscillator (VCO) having an output frequency that is dependent upon the voltage applied to a control input to the VCO. The output of the voltage controlled oscillator provides a selected frequency as a desired output and also provides feedback to one input of a phase detector. The phase detector has a second input that receives a reference frequency. The phase detector compares the VCO output to the reference frequency input and provides an output signal used to control the VCO through a loop filter such that the output frequency of the VCO is locked to the reference frequency. In this manner, the phase locked loop can be constructed to provide an output frequency that tracks the reference frequency input signal with a high degree of accuracy.

The phase-locked loop is a negative feedback system that is stabilized by controlling both the phase shift and gain within the loop. The phase shift is controlled by careful selection of the loop filter response parameters. The open loop bandwidth of the phase locked loop is controlled by gain compensation circuits. The open loop bandwidth and the phase margin of the phase locked loop determine phase noise spectrum, vibration susceptibility, and settling time of the PLL. The open loop bandwidth may be modified to improve these performance characteristics by the use of gain compensation circuits.

Several solutions exist in the art to provide gain compensation for phase locked loops. Commercially available devices such as the Analog Devices AD42XX series, for example, incorporate a programmable register to control a charge pump current source in a phase detector to control the gain.

U.S. Pat. No. 4,595,886 discloses a circuit for adjusting the AC loop gain and DC prepositioning in a phase locked loop. The system includes an in-phase and out-of-phase signal applied through exclusive-OR gate circuitry that includes inputs from a PROM to digitally adjust the AC gain in the phase locked loop. The PROM also stores digital values representing a desired DC prepositioning level. The PROM outputs with the digital values are coupled to the phase locked loop and converted to provide a signal summed with the AC signal to adjust the prepositioning level.

The prior art solutions yield hardware that controls the current or voltage at the phase detector output in a linear fashion. Since gain is a logarithmic function of these variables, linear current or voltage control yields a gain control characteristic that is non-linear.

What is needed is a phase locked loop with a gain adjustment capability to maintain a desired open loop gain bandwidth by providing a phase detector with a linear gain selection characteristic.

SUMMARY OF THE INVENTION

In accordance with the present invention, a phase detector having a linear gain characteristic output signal is disclosed.

The phase detector comprises a first exclusive-OR gate with a first input connected to an input signal and a second input connected to a reference signal and a second exclusive-OR gate with a first input connected to an inverted input signal and a second input connected to the reference signal. A first plurality of switches has inputs connected to an output of the first exclusive-OR gate. A first plurality of resistors has a first terminal of each resistor connected to outputs of the first plurality of switches. A second plurality of switches has inputs connected to an output of the second exclusive-OR gate. A second plurality of resistors has a first terminal of each resistor connected to the outputs of the second plurality of switches. The first plurality of switches and the second plurality of switches have control inputs connected to gain selection signals to enable the switches in corresponding pairs. The resistors' second terminals are connected together and the resistors are selected in corresponding pairs by the corresponding pairs of switches to form a linear gain characteristic output signal in accordance with the gain selection signals. The phase detector may include a third exclusive-OR gate with a first input connected to the reference signal and a second input connected to a sense select signal. The third exclusive-OR gate output is connected to a second input of the first exclusive-OR gate and a second input of the second exclusive-OR gate to select the sense of the phase detector. Resistor values Ra of the first plurality of resistors are determined by the equation $Ra=Rs/\alpha_i$ and resistor values Rb of the second plurality of resistors corresponding to resistor values Ra are determined by the equation $Rb=Rs/(1-\alpha_i)$.

It is an object of the present invention to provide a gain adjustment capability to a phase locked loop that is linear.

It is an advantage of the present invention to provide a phase detector with linear gain selection capability.

It is a feature of the present invention to easily provide linear gain selection with complementary resistor pairs.

BRIEF DESCRIPTION OF THE DRAWINGS

The invention may be more fully understood by reading the following description of the preferred embodiments of the invention in conjunction with the appended drawings wherein.

DETAILED DESCRIPTION

Figure 1:
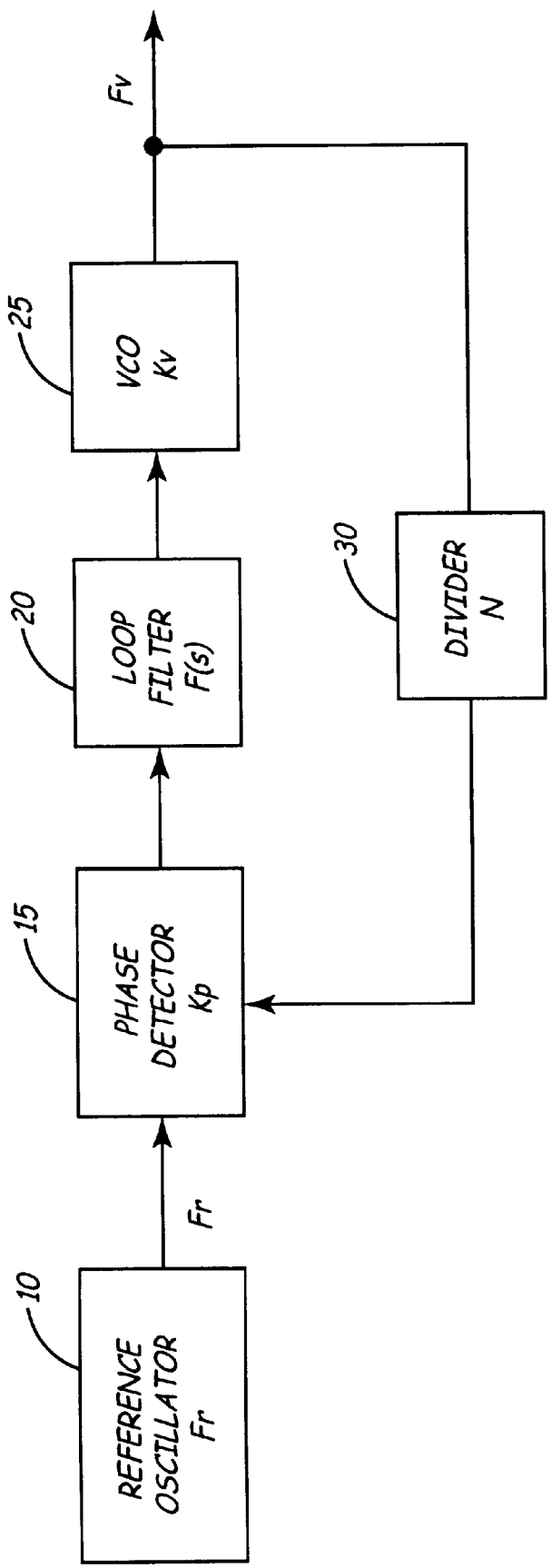
FIG. 1 is a block diagram of a basic phase locked loop known in the art.

FIG. 1 shows a basic phase locked loop (PLL) well known in the art. A voltage-controlled oscillator (VCO) 25 provides an output signal Fv at a frequency determined by a control voltage on an input to the VCO 25. The VCO 25 output is also provided to a divider 30 that divides the VCO output frequency by a divide ratio N. The divider 30 output is provided as an input to a phase detector 15. A reference oscillator 10 provides a reference frequency input Fr to the phase detector 15. The phase detector 15 compares the VCO output Fv divided by N by the divider 30 to the reference frequency Fr to determine a phase error output. The phase detector 15 output is filtered in a loop filter 20. Loop filter 20 sets the phase locked loop bandwidth and response characteristics.

In FIG. 1, the phase detector 15 gain is Kp, the loop filter response is F(s), and the VCO gain is Kv. The open loop gain of the PLL in FIG. 1 is given in Equation 1 below.

$$A(s) = \frac{-Kp\ Kv\ F(s)}{sN} \quad \text{Equation 1}$$

Figure 2:
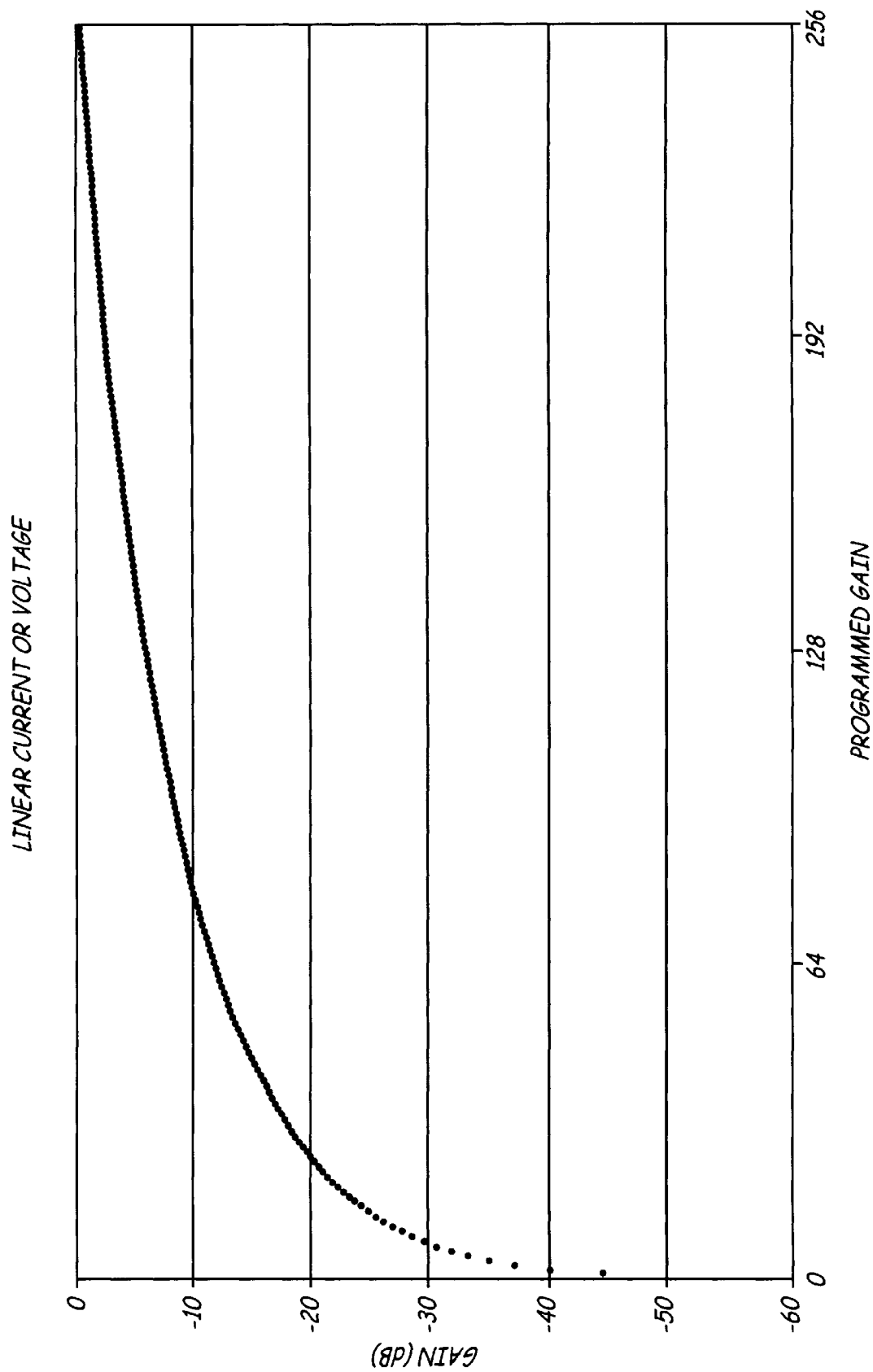
FIG. 2 is a graph showing the nonlinear gain characteristic of prior art phase detectors.

In order to optimize phase locked loop performance, the open loop gain parameters of Equation 1 may be modified or compensated. U.S. Pat. No. 4,595,886 discloses a circuit for adjusting the AC loop gain and DC prepositioning in a phase locked loop. In the reference patent, a phase locked loop is constructed using a voltage-controlled oscillator that provides an output frequency signal and has a control input. The output frequency signal is coupled to an input of a phase detector. The phase detector has a second input connected to a reference frequency input. The output of the phase detector is coupled to a plurality of exclusive OR-gates. The outputs of the plurality of exclusive-OR gates are coupled through a ladder network to form an output signal with variable gain digitally controlled by a programmable-read-only memory (PROM) in response to frequency control inputs to alter the AC gain. Additional digital data stored in the PROM is also coupled through a ladder network to define the DC prepositioning level by use of an output signal from the ladder network that is combined in a summing circuit with the AC gain control signal to produce the combined control signal output to the voltage controlled oscillator. By PROM programming, the digital data stored in the PROM can be used to control the AC gain and the DC prepositioning level by selectively altering the ladder networks of each signal control. Since gain is a logarithmic function of these variables, linear voltage control yields a gain control characteristic that is nonlinear. This is shown in FIG. 2 where the programmed gain is the gain set by the PROM in selecting resistors in an R-2R ladder network of the referenced patent and is shown as linear on the x-axis. The loop gain is shown on the y-axis. As can be seen in FIG. 2, the programmed gain vs. loop gain curve is nonlinear.

It is desirable to have a linear programmed gain vs. loop gain in some applications. In non-linear gain compensation circuits, the gain resolution is a function of the control signal. If an adjustment is required, it is difficult to predetermine the control signal that would realize the desired adjustment. In linear gain compensation circuits, the gain resolution is fixed which can yield a simpler gain compensation algorithm.

Figure 3:
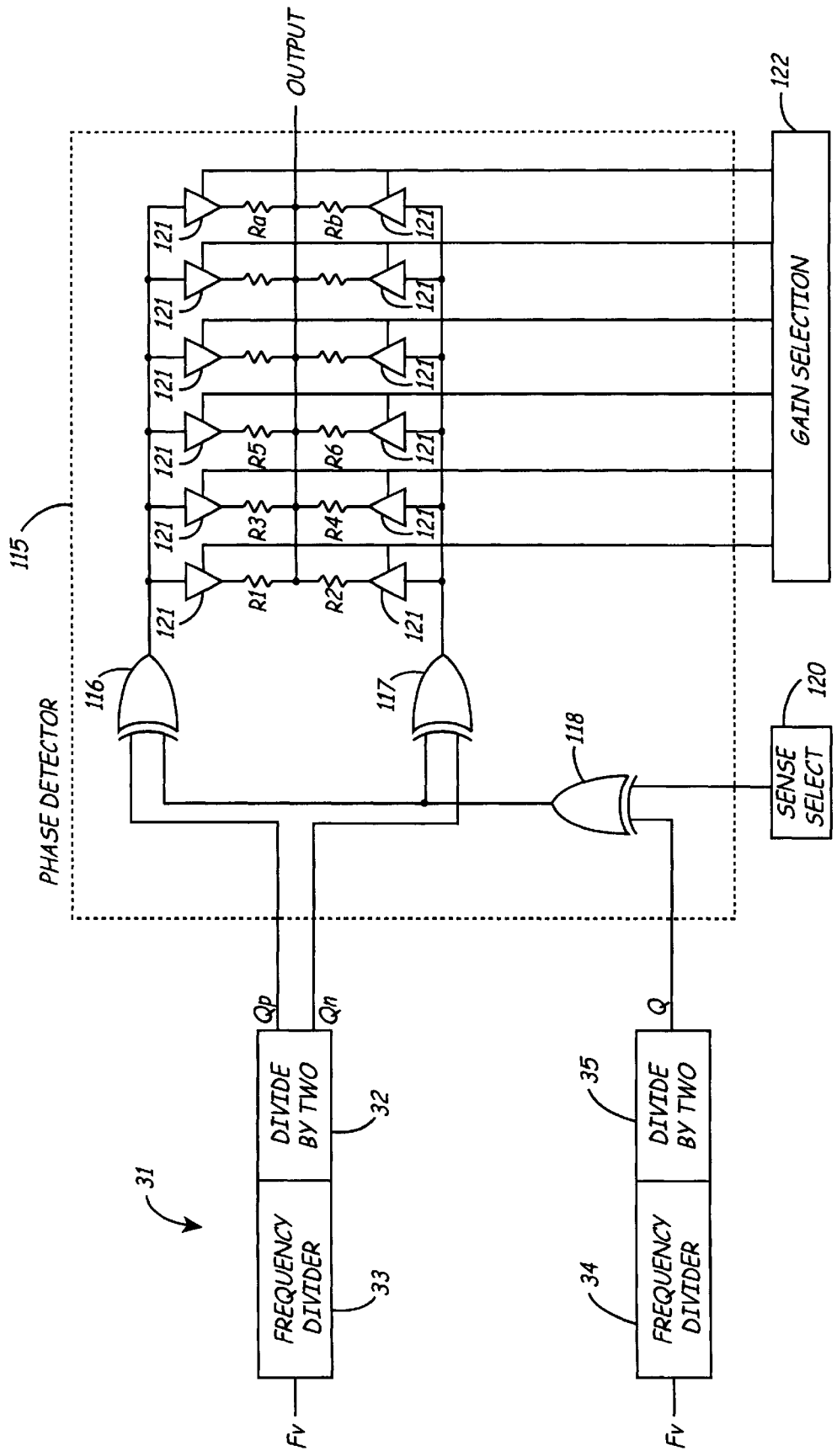
FIG. 3 is a block diagram of a phase detector of the present invention having a linear gain characteristic.

A phase detector with linear gain selection 115 in accordance with the present invention is shown in FIG. 3. The phase detector 115 may be inserted in the phase locked loop of FIG. 1 in place of the phase detector 15 shown therein. In FIG. 3, the divider 31 performs the function of divider 30 of FIG. 1 in dividing a VCO 25 signal Fv. In the divider 31, the output is divided by two in divider 32 in order to provide two signals Qp and Qn with one inverted or shifted 180 degrees from the other and both with a 50% duty cycle to the phase detector 115. Divider 33 may be used to perform division by another factor to arrive at the desired divide by N. The reference frequency signal Fr may be divided by a reference frequency divider 34 if needed. The reference frequency signal Fr is divided by two in divider 35 to provide a common reference frequency signal Q with a 50% duty cycle to the phase detector 115.

The phase detector 115 in FIG. 3 utilizes two complementary exclusive-OR gate logic functions 116 and 117. The exclusive-OR gates 116 and 117 have the common reference frequency signal Q derived from the reference frequency signal Fr and the two signals Qp and Qn derived from the VCO output signal as inputs. The first exclusive-OR gate 116 has its first input connected to the Qp signal. The second exclusive-OR gate 117 has its first input connected to the Qn signal. The first exclusive-OR gate 116 and the second exclusive-OR gate 117 both have their second inputs connected to the common reference frequency signal Q. The common reference frequency signal Q may be used directly or inverted by a third exclusive-OR gate 118 to change the sense of the phase detector 115. The sense is changed by a sense select input signal 120 that may be logic one or zero. The third exclusive-OR gate 118 may be eliminated.

Figure 4:
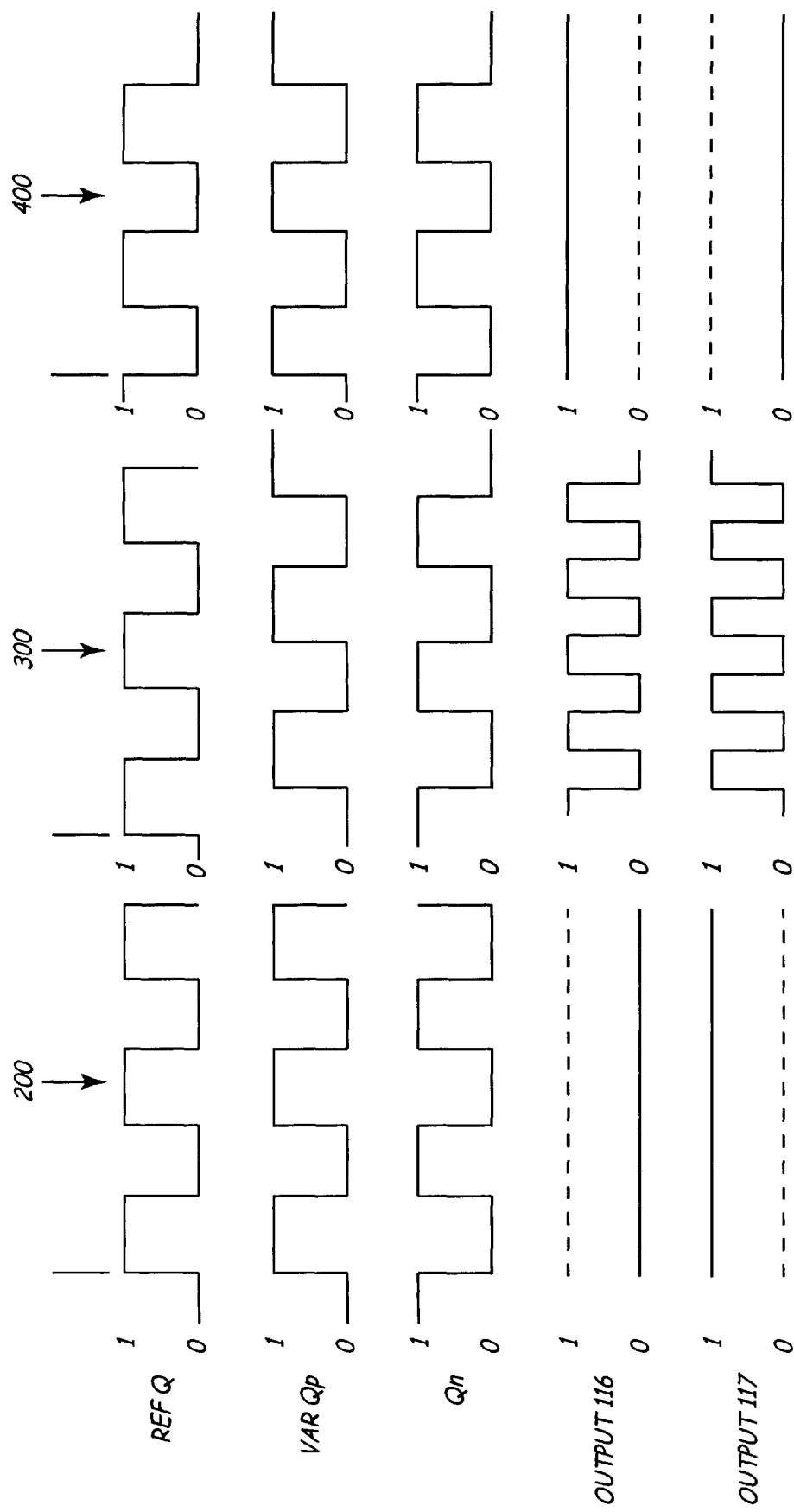
FIG. 4 is a diagram showing the output waveforms of exclusive-OR gates in the phase detector of FIG. 3.

Operation of the exclusive-OR gates 116 and 117 is shown in exemplary fashion in FIG. 4 for three sets of conditions. In FIG. 4 under the first set of conditions in area 200, the reference frequency input Q is shown in phase with the Qp input signal. The Qn signal is 180 degrees out of phase or the inverse of the Qp signal and shown 180 degrees out of phase with the Q signal. The output of the first exclusive-OR gate 116 is at a continuous logic zero. The output of the second exclusive-OR gate 117 is at a continuous logic one or the inverse of the first exclusive-OR gate 116 output.

In FIG. 4 under the second set of conditions in area 300, the phase of the Qp and Qn signals has shifted by approximately 90 degrees as shown. This results in the first exclusive-OR gate 116 output as shown as a signal with a duty cycle of about 50% and at twice the rate of the input signals. The second exclusive-OR gate 117 output is again the inverse of the first exclusive-OR gate 116. As the phase relationship of Qp and its inverse Qn changes relative to the reference signal Q, the duty cycle of the output of the first exclusive-OR gate 116 and the second exclusive-OR gate 117 changes.

In FIG. 4 under the third set of conditions in area 400, the signals of the first set of conditions 200 are shown with the reference signal Q inverted. This will occur if the sense signal select 120 of FIG. 3 selects the opposite sense of the phase detector 115. The third set of conditions 400 may also occur if Qp and Qn signals change in phase by 180 degrees.

The outputs of the exclusive-OR gates 116 and 117 are connected to switches 121 as shown in FIG. 3. The switches 121 may of any type of switch known in the art. The outputs of the switches 121 are connected to a first terminal of each resistor in a network of resistors. The second terminal of each resistor in the plurality of resistors are connected together to form the output of the phase detector 115. The switches 121 are turned on and off in corresponding pairs as shown by the interconnection in FIG. 3 by gain selection signals from a gain selection function 122 to select a desired gain. The gain selection function 122 may be a microprocessor or some other system control function that sets the phase lock loop gain and may set the operating frequency and other parameters of the phase locked loop.

The output of exclusive-OR gate 116 is connected to a first plurality of switches 121 and first plurality of resistors with values Ra. The output of exclusive-OR gate 117 is connected to a second plurality of switches 121 and a second plurality of resistors with values Rb. The values of the resistors are determined in the equations below:

$$Ra = Rs/\alpha_i \quad \text{Equation 2}$$

and $$Rb = Rs/(1-\alpha_i) \qquad \text{Equation 3}$$

where Rs is an independent resistance variable and $\alpha_i$ is a voltage attenuation factor. The voltage attenuation factor $\alpha_i$ is a function of the desired gain resolution and is determined as follows. Given a desired peak-to-peak output voltage reference $V_{ref}$ and a desired gain resolution, the peak-to-peak output voltage swing is first calculated using $$V_i = V_{ref} 10^{A_i/20} \qquad \text{Equation 4}$$

where $A_i$ is the gain attenuation factor expressed in decibels. For each peak-to-peak output voltage $V_i$, there is a corresponding maximum output voltage $V_{imax}$ and minimum output voltage $V_{imin}$. Either one may be used to determine the corresponding voltage attenuation factor $\alpha_i$ since the phase-detector output signal is derived from the complementary exclusive-or gate output signals. In order to determine the output voltage extremes, it is necessary to also understand that the average output voltage, $(V_{imax}+V_{imin})/2$, is one-half of the peak output voltage at either exclusive-or gate. This is the basis of any good phase-detector gain compensation circuit since the average output voltage should not be a function of the gain setting. Assuming that both exclusive-or gates 116 and 117 use the same supply voltage, designated $V_{cc}$, then $$V_{imin} = \frac{V_{cc} - V_i}{2} \qquad \text{Equation 5}$$

and the voltage attenuation factor $\alpha_i$ follows from $$\alpha_i = \frac{V_{imin}}{V_{cc}}. \qquad \text{Equation 6}$$

The resistance values Ra and Rb are connected to the outputs of exclusive-OR gates 116 and 117 through switches 121 and must be chosen in corresponding pairs in accordance with Equations 2 and 3 to obtain linear gain selection. The number of switch and resistor corresponding pairs is determined by a desired number and size of gain steps in the phase detector 115.

The table below shows in exemplary fashion typical values that may be used for Ra and Rb. Ra and Rb are obtained from Equation 2 and 3 respectively and $\alpha_i$ is obtained from equation 6. In the table Rs=1000 ohms, the desired gain is controlled in −1 dB steps from 0 to −10 dB, $V_{cc}$=4 volts and $V_{ref}$=2 volts. As an example, the voltage attenuation factor $\alpha_i$ for $A_i$=−8 dB is calculated as $$V_i = (2)(10^{-8/20}) \cong 0.7962 \text{ volts}$$

$$V_{imin} = \frac{4 - 0.7962}{2} \cong 1.6019 \text{ volts}$$

$$\alpha_i = \frac{1.6019}{4} \cong 0.4005$$

In addition, in a manner similar to that shown above, the necessary voltage attenuation factors $\alpha_i$ can be derived from $V_{imax}$. Using standard resistor values for Ra and Rb may change the attenuation values somewhat from those shown in the table.

| $A_i$ dB | $\alpha_i$ | Ra Ohms | Rb Ohms |
|---|---|---|---|
| 0 | 0.2500 | 4000 | 1333.3 |
| −1 | 0.2772 | 3607.7 | 1383.5 |
| −2 | 0.3014 | 3317.7 | 1431.5 |
| −3 | 0.3230 | 3095.9 | 1477.1 |
| −4 | 0.3423 | 2921.7 | 1520.4 |
| −5 | 0.3594 | 2782.3 | 1561.1 |
| −6 | 0.3747 | 2668.8 | 1599.2 |
| −7 | 0.3883 | 2575.2 | 1634.9 |
| −8 | 0.4005 | 2497.0 | 1668.0 |
| −9 | 0.4113 | 2431.3 | 1698.7 |
| −10 | 0.4209 | 2375.6 | 1726.9 |

As an example from the above table, resistor R1 and R2 in FIG. 3 may 4000 ohms and 1333.3 ohms respectively for a reference attenuation of 0 dB. Resistors R3 and R4 may be 3607.7 ohms and 1383.5 ohms respectively for an attenuation of −1 dB. The remaining attenuation and resistor values may then be used for the resistors Ra and Rb of FIG. 3. In FIG. 3 only six pairs of resistors Ra and Rb and switches 121 are shown and five more pairs need to be added to complete the phase detector 115 circuit in accordance with the table above.

In operation the gain selection function 122 selects corresponding pairs of resistors Ra and Rb and corresponding pairs of switches 121 in accordance with the table above to obtain a desired attenuation as previously described.

Figure 5:
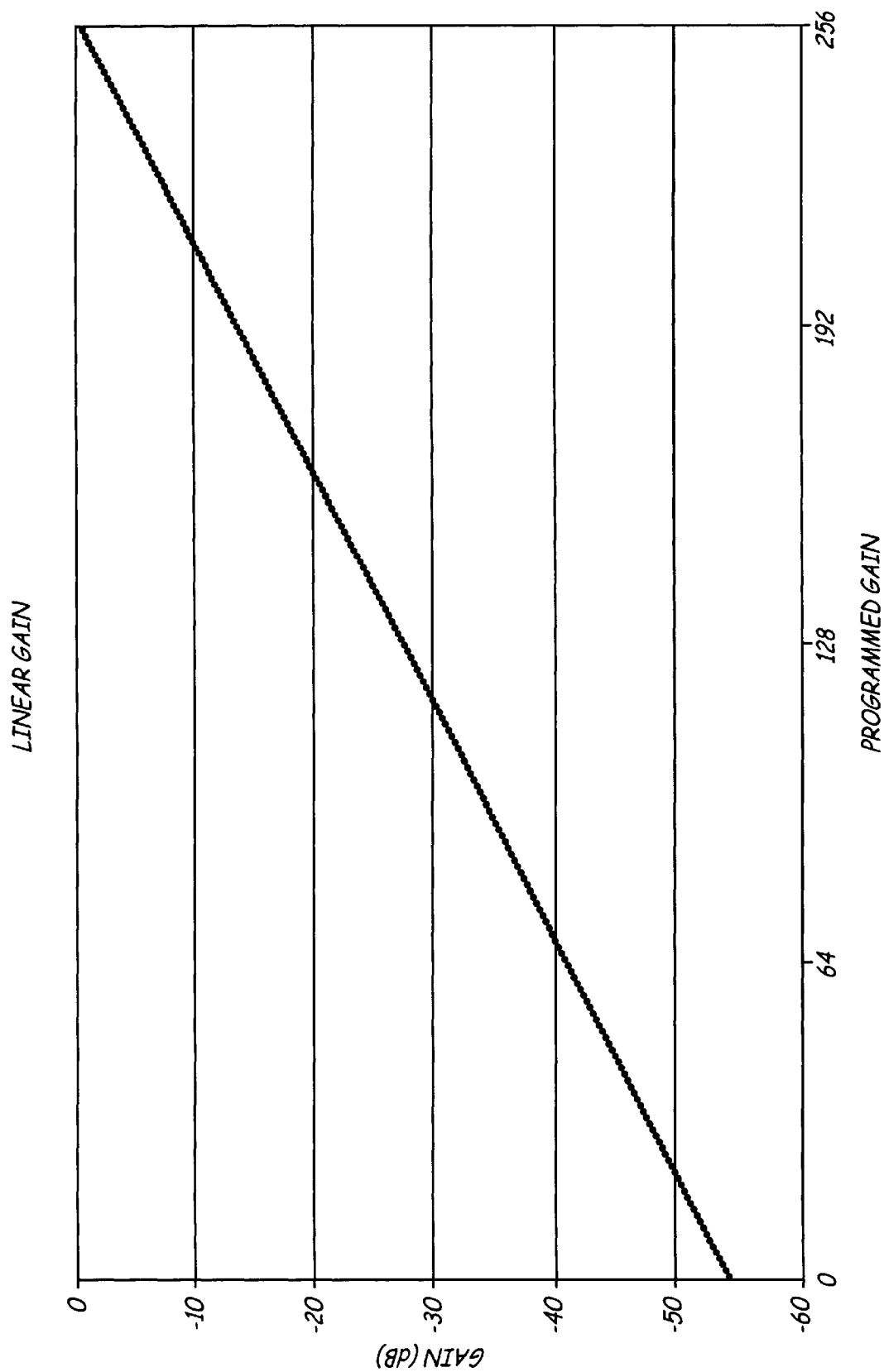
FIG. 5 is a graph showing the linear gain characteristic of the phase detector of the present invention.

A graph showing the linear gain operation of the phase detector 115 of the present invention is shown in exemplary fashion in FIG. 5. The graph of FIG. 5 has the same axes as that of FIG. 2. As can be seen the programmed gain vs. gain in dB is now a linear function.

It is believed that the phase detector with linear gain selection of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A phase detector having a linear gain characteristic output signal comprising:
    a first exclusive-OR gate with a first input connected to an input signal with a 50% duty cycle;
    a second exclusive-OR gate with a first input connected to the input signal shifted by 180 degrees;
    a third exclusive-OR gate with a first input connected to a reference frequency input signal with a 50% duty cycle and a second input connected to a sense select signal and an output connected to a second input of the first exclusive-OR gate and a second input of the second exclusive-OR gate;
    a first plurality of switches with inputs connected to an output of the first exclusive-OR gate;
    a first plurality of resistors with a first terminal of each resistor connected to outputs of the first plurality of switches;
    a second plurality of switches with inputs connected to an output of the second exclusive-OR gate;
    a second plurality of resistors with a first terminal of each resistor connected to the outputs of the second plurality of switches; and said first plurality of switches and said second plurality of switches having control inputs connected to gain selection signals to enable the first and second plurality of switches in corresponding pairs; and said first plurality of resistors second terminals and said second plurality of resistors second terminals connected together and selected in corresponding pairs by the corresponding pairs of switches to form a linear gain characteristic output signal in accordance with the gain selection signals.

2. The phase detector of claim 1 wherein resistor values Ra of the first plurality of resistors are determined by an equation $$Ra = Rs/\alpha_i$$

where Rs is an independent resistance value and $\alpha_i$ is a voltage attenuation factor.

3. The phase detector of claim 2 wherein resistor values Rb of the second plurality of resistors corresponding to the resistor values Ra are determined by an equation $$Rb = Rs/(1-\alpha_i).$$

4. A phase detector having a linear gain selection capability for an output signal comprising:

a first exclusive-OR gate with a first input connected to an input signal and a second input connected to a reference signal;

a second exclusive-OR gate with a first input connected to an inverted input signal and a second input connected to the reference signal;

a first plurality of switches with inputs connected to an output of the first exclusive-OR gate;

a first plurality of resistors with a first terminal of each resistor connected to outputs of the first plurality of switches;

a second plurality of switches with inputs connected to an output of the second exclusive-OR gate;

a second plurality of resistors with a first terminal of each resistor connected to the outputs of the second plurality of switches; and said first plurality of switches and said second plurality of switches having control inputs connected to gain selection signals to enable the first and second plurality of switches in corresponding pairs; and said first plurality of resistors second terminals and said second plurality of resistors second terminals connected together and selected in corresponding pairs by the corresponding pairs of switches to form a linear gain output signal in accordance with the gain selection signals.

5. The phase detector of claim 4 further comprising a third exclusive-OR gate with a first input connected to a reference frequency input signal and a second input connected to a sense select signal to select the sense of the phase detector and an output connected to a second input of the first exclusive-OR gate and a second input of the second exclusive-OR gate.

6. The phase detector of claim 4 wherein resistor values Ra of the first plurality of resistors are determined by an equation $$Ra = Rs/\alpha_i$$

where Rs is an independent resistance value and $\alpha_i$ is a voltage attenuation factor.

7. The phase detector of claim 6 wherein resistor values Rb of the second plurality of resistors corresponding to the resistor values Ra are determined by an equation $$Rb = Rs/(1-\alpha_i).$$

* * * * *